United States Patent
Nagazumi

[11] Patent Number: 5,867,526
[45] Date of Patent: Feb. 2, 1999

[54] MATCHED FILTER ACTING IN CHARGE DOMAIN

[75] Inventor: Yasuo Nagazumi, 6-10, Meguro 4-chome, Meguro-ku, Tokyo, 153, Japan

[73] Assignees: G.D.S Co., Ltd.; Yasuo Nagazumi, both of Tokyo, Japan

[21] Appl. No.: 997,848

[22] Filed: Dec. 24, 1997

[51] Int. Cl.[6] .............................. H04B 1/707; H03H 15/02
[52] U.S. Cl. ................... 345/207; 375/316; 364/724.11; 333/165
[58] Field of Search ...................................... 375/200, 207, 375/316, 343, 324; 364/724.11, 844, 825; 333/165; 327/271

[56] References Cited

U.S. PATENT DOCUMENTS

| | | | |
|---|---|---|---|
| 3,819,958 | 6/1974 | Gosney | 333/165 |
| 3,987,293 | 10/1976 | Crooke et al. | |
| 4,120,035 | 10/1978 | Cases et al. | |
| 4,218,752 | 8/1980 | Hewes et al. | 364/825 |
| 4,882,668 | 11/1989 | Schmid et al. | 364/724.11 |
| 5,539,404 | 7/1996 | Nagazumi. | |
| 5,719,899 | 2/1998 | Jorn Theilecke et al. | 375/343 |

FOREIGN PATENT DOCUMENTS 6-164320  6/1994  Japan.

*Primary Examiner*—Temesghen Ghebretinsae

[57] ABSTRACT

A charge mode operation circuit dedicated to detect the correlation between analog input signal and digital code, and for realizing by "RAKE method" the path diversity reception from the correlation data obtained using the same. The circuit utilizes an analog shift register using at least one charge transfer device for transferring a charge signal packet, a plurality of charge signal generation units, arranged along the analog shift register and provided, respectively, with substantially uniform voltage charge conversion characteristic controlled by a common input sign; and a routing mechanism for selectively transferring output charge packets generated by the plurality of charge signal generation units in given directions according to digital bit signal provided separately.

13 Claims, 6 Drawing Sheets

MATCHED FILTER ACTING IN CHARGE DOMAIN

BACKGROUND OF THE INVENTION

1. Technical Field of the Invention

The present invention relates to a matched filter acting in charge domain which can be used for a communication apparatus, a signal processing equipment or the like.

2. Prior Art

As the result of digital technology development, CMDA (Code Division Multiple Access) communication or other digital modulation methods are becoming popular rapidly; however the function required to the system is attaining such a high level that it can be hardly realized with conventional methods using digital processing in respect of system size or power consumption and this problem has became already evident in power supply limited applications such as portable terminals.

As an approach for solving these problems, new methods introducing analog processing such as Japanese Patent Laid-Open No. Hei 6-164320 are being developed, sloughing off ineffective power consumption inherent to conventional digital signal processing.

However, one can hardly affirm that these methods allow to realize a large-scale analog shift register corresponding to future enlargement of modulation code, or to establish so far a technology which would be able to correspond for a long term to commercialization constrictions such as further reduction of power consumption.

The present invention intends to compose a charge mode operation circuit dedicated to detect the correlation between analog input signal and digital code using charge transfer devices such as CCD of which technology is already established, famous for its low power consumption, and moreover, to propose a charge mode operation circuit composition for realizing by "RAKE method" the path diversity reception from the correlation data obtained using the same.

SUMMARY OF THE INVENTION

The present invention has been made considering the view point as mentioned above, and its main invention intends to provide a matched filter acting in charge domain, comprising:

an analog shift register using at least one charge transfer device for transferring charge signal packet;

a plurality of charge signal generation units, arranged along said analog shift register and provided respectively with substantially uniform voltage charge conversion characteristic controlled by a common input signal; and a routing mechanism for selectively transferring output charge packets generated by the plurality of charge signal generation units in given directions according to digital bit signals provided separately;

wherein at least one of a plurality of output routs from said routing mechanism is connected to any of potential wells formed on said analog shift register, and in these potential wells, the addition in charge domain of signals generated in said charge signal generation units and charge signals transferred along the analog shift register for transferring in synchronization therewith is executed.

DETAILED DESCRIPTION OF THE PREFERRED EMBODIMENTS

Figure 1:
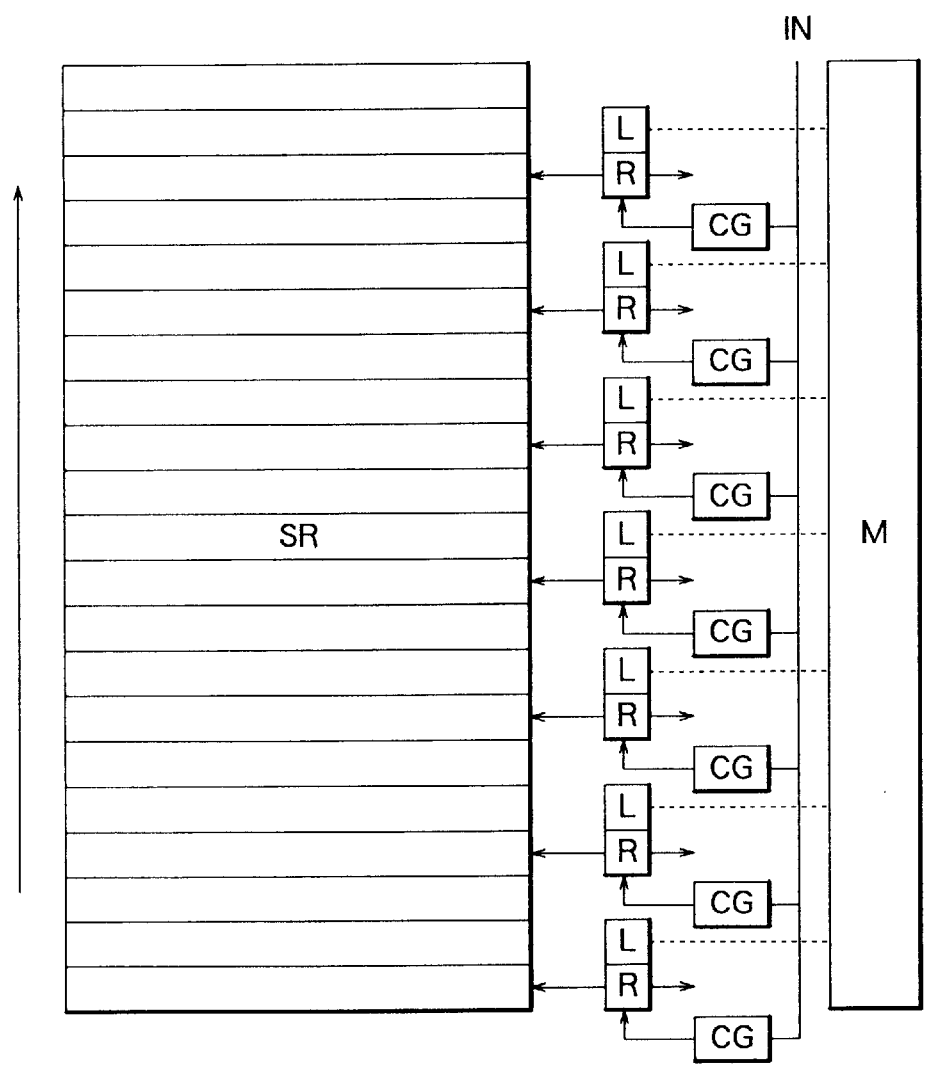
FIG. 1 is a composition drawing showing a matched filter of an embodiment of the present invention.

FIG. 1 shows an example of composition wherein charge signal packets respectively supplied from a plurality of charge signal generation units CG controled commonly by an input signal IN are supplied selectively to analog shift registers SR using routing mechanisms R for determining its operation mode, namely its transfer rout according to bit signal of matching code supplied from a digital memory means M such as shift register and latched by signal latch units L, for executing addition operation on said analog shift registers SR.

This example has a composition wherein only one of output from the routing mechanisms R is connected to the analog shift register SR and the other output is not specially used and abandoned.

Figure 2:
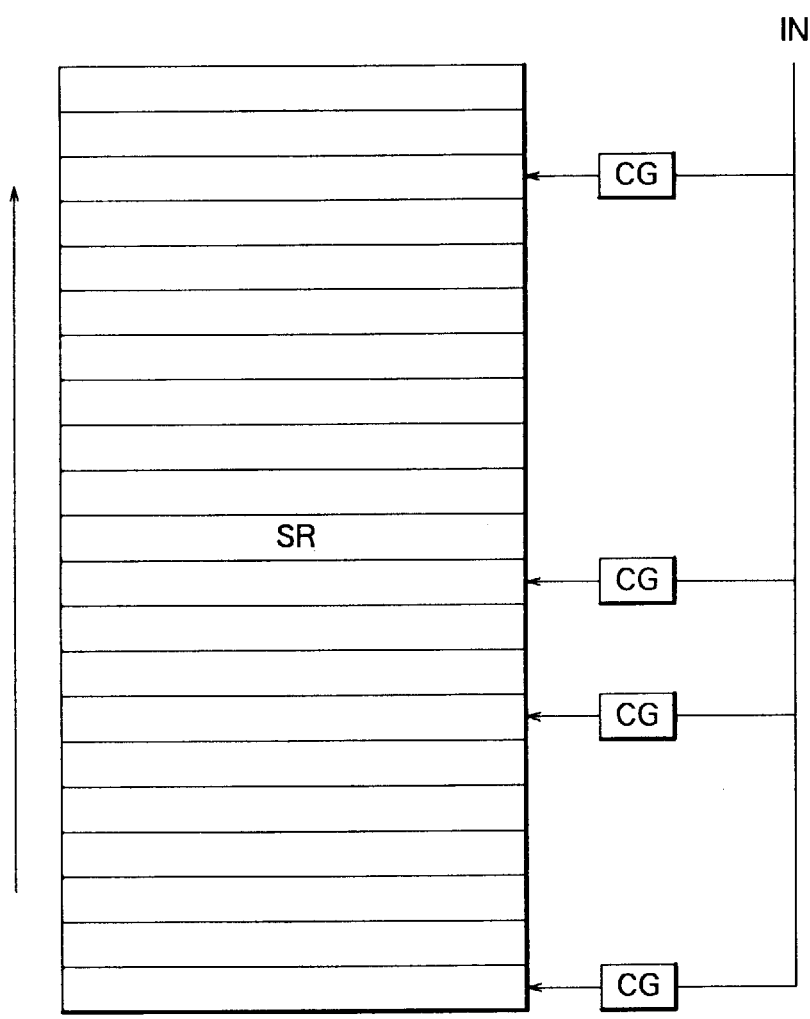
FIG. 2 is a composition drawing showing a circuit connection equivalent to the case where the bit signal stored in the signal latch unit L shown in FIG. 1 is constant.

FIG. 2 illustrates a circuit connection equivalent to the case where bit signals stored in the signal latch unit L as shown in FIG. 1 are constant.

In this case, as the transfer direction of charge signal generated by individual charge signal generation unit CG is always constant, the routing mechanism R is useless, and also charge signal destined to be abandoned needs not to be generated, so charge signal generation units other than a portion thereof need not to be installed, making the circuit simpler, and moreover this composition will be extremely advantageous in respect of power consumption.

Figure 3:
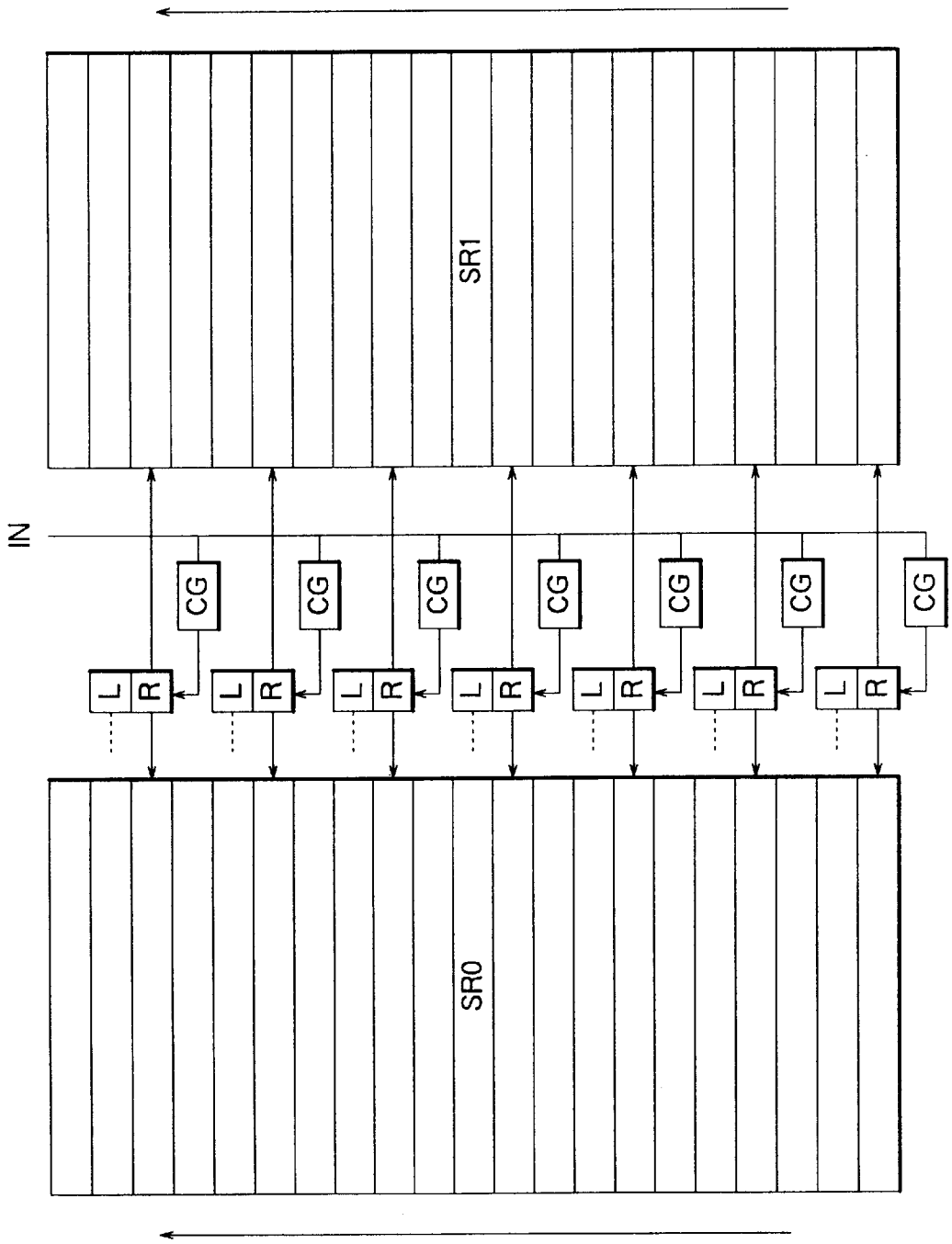
FIG. 3 is a composition drawing showing a matched filter of another embodiment of the present invention.

FIG. 3 illustrates a composition of the matched filter MF having a composition similar to the example of FIG. 1, comprising two analog shift registers SR0, SR1 and obtaining a differential form matching output using all respective two outputs from the routing mechanism R.

Naturally, such differential output generation can be realized with a single analog shift register in the same way as that in FIG. 3 provided that as much gates as necessary are disposed.

Figure 4:
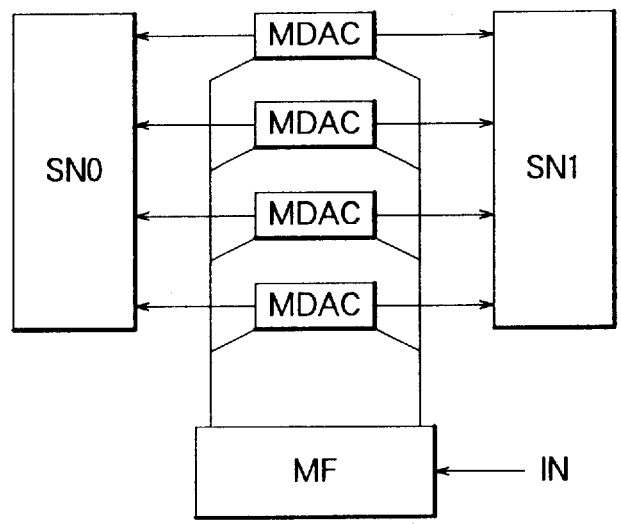
FIG. 4 is a composition drawing illustrating an example of RAKE type demodulator, wherein differential output signal from the matched filter MF shown in FIG. 3 is supplied to a plurality of four quadrant MDACs (multiplication type DA converters) disposed on the prolongation of the analog shift registers SR0, SR1, respectively executing multiplication with digital tap function value supplied separately, and synthesizing their results in differential form by two summing nodes SN0, SN1 to perform the path diversity modulation.

FIG. 4 illustrates an example of RAKE type demodulator, wherein a differential output signal from the matched filter MF shown in FIG. 3 is supplied to a plurality of four quadrant MDACs (multiplication type DA converters) disposed on the prolongation of the analog shift registers SR0, SR1, respectively executing multiplication with digital tap function value (not shown) supplied separately, and synthesizing their results in differential form by two summing nodes SN0, SN1 to perform the path diversity modulation.

Note that, as example of said MDACs, a MDAC of the type operating in charge domain, such as U.S. Pat. No. 5,539,404, is most appropriate; however, similar operation can be achieved also by an ordinary DA converter naturally by using the conversion between charge and voltage.

In this example, while it is shown an example of executing multiplication of digital tap function values using four quadrant multiplication; when a matched filter supplying non differential form matching output as shown in FIG. 1 is to be adopted, naturally the MDACs are only required to provide two quadrant multiplication function and output summing node also can be composed of a single one depending on the conditions such as required accuracy or the like.

Figure 5:
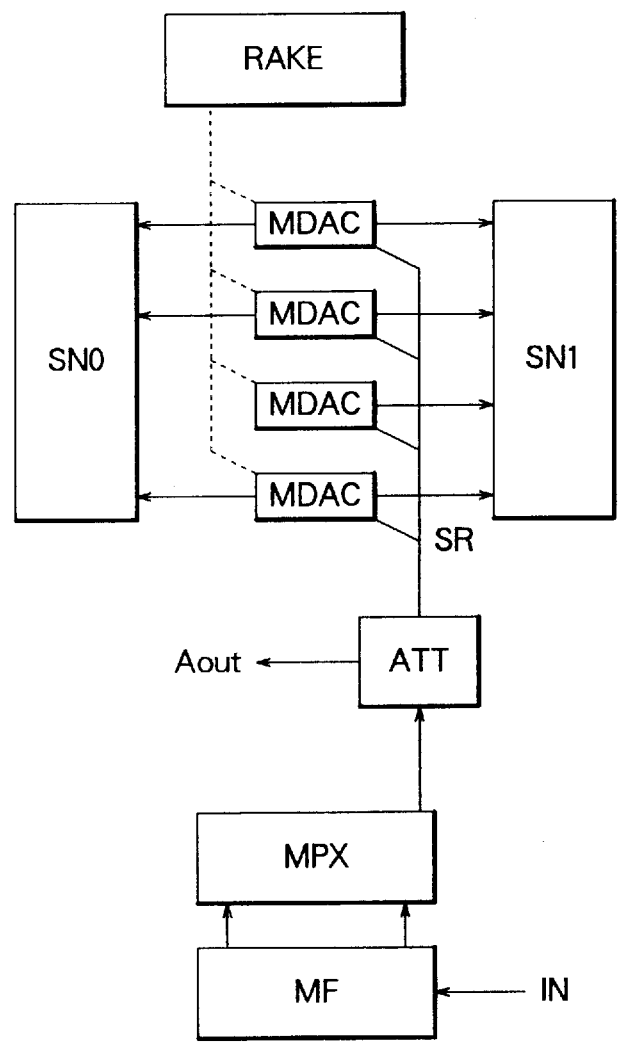
FIG. 5 is a composition drawing showing another example of RAKE type demodulator.

FIG. 5 is a composition diagram showing another embodiment of RAKE type demodulator.

In FIG. 5, a multiplexer MPX multiplexes differential output of the matched filter by time-division multiplexing, and performs attenuation processing by a charge signal attenuator ATT, before supplying respective one of a plurality of four quadrant multiplication type MDACs with it as input signals.

On the other hand, the RAKE control unit "RAKE" supplies respective MDACs with digital form tap function values.

This RAKE control unit "RAKE", such as ordinary RAKE type demodulator, performs the function of identifying multi-path characteristics of a communication line based on the matched filter output and individually determining said tap function values according to the reliability of individual path.

In the case of this example, said tap function can be determined, for instance, by measuring charge signal Aout abandoned by the charge signal attenuator ATT.

Naturally, said tap function can also be determined, outside the illustrated equipment, by more precise multi-path measurement data or the like, obtained from the output, which is correlation-processed by another matched filter unit, the signal, generally called sounder, set for multi-path measurement included in reception signals.

Figure 6:
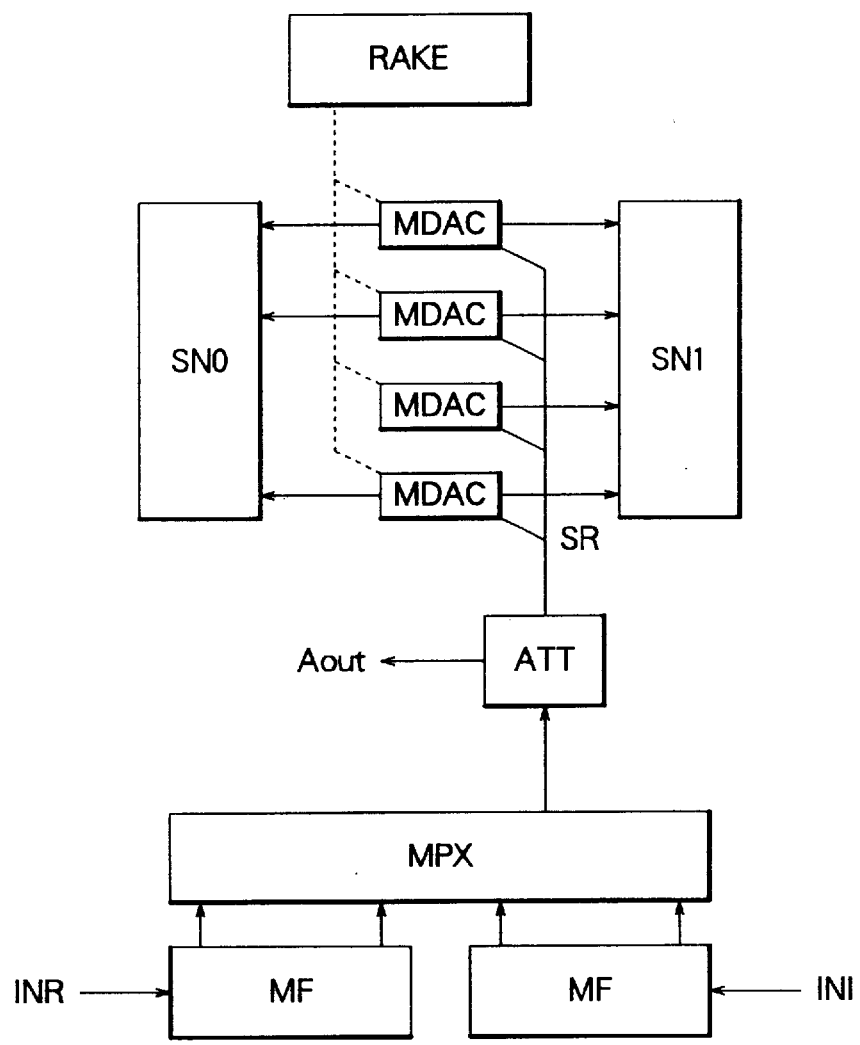
FIG. 6 is a composition drawing showing an example of RAKE type signal demodulator for demodulating signals, by installing two sets of composition of FIG. 5 and taking as respective inputs orthogonal form two series of base band signals INI, INR.

FIG. 6 illustrates an example of RAKE type signal demodulator for demodulating signal, by installing two sets of composition of FIG. 5 and taking as respective inputs the orthogonal form two series of base band signals INI, INR.

In the composition of this example, the multiplexer MPX is supplied with outputs from two matched filters, and, respectively as multiplexed, they are attenuated by a charge signal attenuator ATT and then all added by common summing nodes SN0, SN1.

Here, as the RAKE control unit "RAKE" supplies respective MDACs with a coefficient obtained by multiplying a tap coefficient according to the reliability of each path with a phase compensation coefficient for correcting phase characteristics inherent to individual paths, it attenuates the effect of phase dispersion and variation of each path contained in the input and a stable output can be ensured.

Single chip type compact RAKE type modulator or the like can be constructed by composing a small and low power consumption matched filter without using an active device, and using extremely low power consumption charge transfer device such as CCD and, moreover, by adding a product sum operation circuit acting in charge domain.

This allows to miniaturize and assure a longer battery life of portable communication gear of the communication method such as CDMA method using long code expected to be realized in the future.

What is claimed is:

1. A RAKE type signal demodulator, comprising:
    a matched filter acting in charge domain, including,
        an analog shift register using at least one charge transfer device for transferring a charge signal packet,
        a plurality of charge signal generation units, arranged along said analog shift register provided, respectively, with substantially uniform voltage charge conversion characteristic controlled by a common input signal, and
        a routing mechanism for selectively transferring output charge packets generated by said plurality of charge signal generation units in given directions according to digital bit signal provided separately, wherein, at least one of a plurality of output routs from said routing mechanism is connected to any of potential wells formed on said analog shift register, and in these potential wells, the addition of signals generated in said charge signal generation units and charge signals transferred along said analog shift register for transferring in synchronization therewith is executed in charge domain;
    a plurality of multiplication type DA converters for selectively taking as an input signal the output signal packet composing time series of said matched filter and for executing multiplication with coefficient digital data supplied separately; and
    at least one signal addition circuit for addition-processing of outputs from said converters.

2. The RAKE type signal demodulator according to claim 1, wherein the number of said analog shift registers are two.

3. The RAKE type signal demodulator according to claim 1, wherein said digital bit signal is supplied by a signal latch unit disposed corresponding to said routing mechanism, and said signal latch unit stores the operation mode of said routing mechanism by selectively latching a matching code signal provided externally.

4. The RAKE type signal demodulator according to claim 2, wherein said digital bit signal is supplied by a signal latch unit disposed corresponding to said routing mechanism, and said signal latch unit stores the operation mode of said routing mechanism by selectively latching a matching code signal provided externally.

5. The RAKE type signal demodulator according to claim 1, wherein
    said coefficient digital data is determined based on the past temporal change of the output from said matched filter or a matched filter prepared separately.

6. The RAKE type signal demodulator according to claim 2, wherein
    said coefficient digital data is determined based on the past temporal change of the output from said matched filter or a matched filter prepared separately.

7. The RAKE type signal demodulator according to claim 3, wherein
    said coefficient digital data is determined based on the past temporal change of the output from said matched filter or a matched filter prepared separately.

8. The RAKE type signal demodulator according to claim 4, wherein
    said coefficient digital data is determined based on the past temporal change of the output from said matched filter or a matched filter prepared separately.

9. The RAKE type signal demodulator according to claim 3, for periodically updating digital bit signals stored in said latch and for executing correlation detection while following the temporal change of the matching code.

10. The RAKE type signal demodulator according to claim 4, for periodically updating digital bit signals stored in said latch and for executing correlation detection while following the temporal change of the matching code.

11. The RAKE type signal demodulator according claim 1, which is composed to specify the function of said routing mechanism to the charge transfer respectively in given directions and to compute exclusively the correlation with fixed matching code.

12. The RAKE type signal demodulator according to claim 2 which is composed to specify the function of said routing mechanism to the charge transfer respectively in given directions and to compute exclusively the correlation with fixed matching code.

13. A RAKE type signal demodulator comprising two matched filter of any of claims 1–12; for computing the correlation taking as respective inputs two series of base band signals including independent component, and for obtaining global output by adding, on a common summing node output charged signal of multiplication result with digital coefficient value provide separately.

* * * * *